United States Patent
Bang et al.

(10) Patent No.: US 7,246,431 B2
(45) Date of Patent: Jul. 24, 2007

(54) METHODS OF MAKING MICROELECTRONIC PACKAGES INCLUDING FOLDED SUBSTRATES

(75) Inventors: Kyong-Mo Bang, Sunnyvale, CA (US); Teck-Gyu Kang, San Jose, CA (US)

(73) Assignee: Tessera, Inc., San Jose, CA (US)

(*) Notice: Subject to any disclaimer, the term of this patent is extended or adjusted under 35 U.S.C. 154(b) by 337 days.

(21) Appl. No.: 10/654,375

(22) Filed: Sep. 3, 2003

(65) Prior Publication Data

US 2004/0115866 A1     Jun. 17, 2004

Related U.S. Application Data

(60) Provisional application No. 60/408,664, filed on Sep. 6, 2002.

(51) Int. Cl.
*H05K 3/30*      (2006.01)
(52) U.S. Cl. .................... 29/835; 29/739; 29/832; 29/834; 29/854; 257/776; 257/786; 361/749; 361/783; 438/118; 438/125
(58) Field of Classification Search ................ 29/825, 29/830–832, 834, 835, 840, 854; 257/684–686, 257/773, 776, 777, 778, 785, 786; 361/749, 361/776, 783; 438/106–113, 118, 123, 612, 438/613, 125
See application file for complete search history.

(56) References Cited

U.S. PATENT DOCUMENTS

| | | |
|---|---|---|
| 3,766,439 A | 10/1973 | Isaacson |
| 3,873,889 A | 3/1975 | Leyba |
| 4,781,601 A | 11/1988 | Kuhl |
| 4,982,265 A | 1/1991 | Watanabe et al. |
| 4,996,587 A | 2/1991 | Hinrichsmeyer et al. |
| 5,046,238 A | 9/1991 | Daigle et al. |
| 5,117,282 A | 5/1992 | Salatino |
| 5,281,852 A | 1/1994 | Normington |
| 5,334,875 A | 8/1994 | Sugano et al. |
| 5,345,205 A | 9/1994 | Kornrumpf |
| 5,376,825 A | 12/1994 | Tukamoto et al. |
| 5,397,916 A | 3/1995 | Normington |
| 5,448,511 A | 9/1995 | Pavrus et al. |
| 5,600,541 A | 2/1997 | Bone et al. |
| 5,646,446 A | 7/1997 | Nicewarner, Jr. et al. |
| 5,776,797 A | 7/1998 | Nicewarner, Jr. et al. |
| 6,028,365 A * | 2/2000 | Akram et al. ............... 257/723 |

(Continued)

FOREIGN PATENT DOCUMENTS

JP     61-029140     2/1986

OTHER PUBLICATIONS

"Ultra-High-Density Interconnect Flex Substrates," HDI, Dec. 1998.

*Primary Examiner*—Minh Trinh
*Assistant Examiner*—Donghai D. Nguyen
(74) *Attorney, Agent, or Firm*—Lerner, David, Littenberg, Krumholz & Mentlik, LLP

(57) ABSTRACT

A microelectronic package is fabricated by a process which includes folding a substrate. A substrate is folded by engaging a folding portion of the substrate with a die so that the folding portion pivots with respect to a first portion of the substrate.

27 Claims, 9 Drawing Sheets

U.S. PATENT DOCUMENTS

| | | |
|---|---|---|
| 6,111,761 A | 8/2000 | Peana et al. |
| 6,225,688 B1 | 5/2001 | Kim et al. |
| 6,300,679 B1 | 10/2001 | Mukerji et al. |
| 6,370,932 B1 | 4/2002 | Liu |
| 6,426,240 B2 | 7/2002 | Isaak |
| 6,441,476 B1 * | 8/2002 | Emoto ........................ 257/686 |
| 6,562,641 B1 | 5/2003 | Freeman |

* cited by examiner

METHODS OF MAKING MICROELECTRONIC PACKAGES INCLUDING FOLDED SUBSTRATES

This application claims the benefit of U.S. Provisional Application No. 60/408,664 filed on Sep. 6, 2002, the disclosure of which is incorporated by reference herein.

BACKGROUND OF THE INVENTION

Certain microelectronic packages are made using a sheet-like element incorporating a dielectric layer and mounting terminals disposed on this structure. Some or all of the terminals are connected to the microelectronic device to be packaged. In many cases, the active microelectronic device such as a semiconductor chip is covered by an encapsulant. The encapsulant commonly is molded in place on the dielectric layer so that the mass of encapsulant has a preselected shape, and so that the encapsulant covers the microelectronic device. The encapsulant may also cover features such as wire bonds which connect the actual chip to the terminals. Such a package may be mounted on a circuit panel such as a circuit board by bonding or otherwise connecting the mounting terminals to contact pads on the circuit board.

Various proposals have been advanced for stacking plural chips one above the other in a common package. One such arrangement includes a substrate having a dielectric structure substantially larger in area than the area of a single microelectronic device or chip. Several microelectronic devices are mounted to the substrate in different areas of the substrate and the substrate is folded so that the various microelectronic devices are stacked one above the other and so that the mounting terminals on the substrate are disposed at the bottom of the stack. Typically, the substrate has electrically conductive traces extending along the dielectric structure. These traces interconnect the microelectronic devices with one another, with the mounting materials or both in the completed structure. In one such structure, the substrate is folded into a serpentine configuration so that the microelectronic devices are stacked one above the other.

If the substrate is folded in precisely the right configuration, the various microelectronic devices will be disposed in the correct locations, one above the other. The entire package can be placed in an area of the circuit board only slightly larger than the area occupied by a single microelectronic device. However, inaccuracies in folding the substrate can cause parts of the package to lie in positions different from their intended position relative to the mounting terminals. This effectively increases the overall size of the package. Neighboring components mounted to the circuit board must be located at a larger distance from the stack so as to provide clearance sufficient to accommodate this internal misalignment within the stack. Moreover, the piece-to-piece differences between individual packages caused by folding inaccuracies can complicate the task of handling and feeding the stacked packages during automated assembly operations as, for example, during mounting to the circuit panel.

As disclosed in commonly assigned U.S. Pat. No. 6,225,688, the disclosure of which is hereby incorporated by reference herein, a folding operation may be performed using a substrate having a plurality of microelectronic devices, and also having connection pads. After folding, the mounting terminals of the substrate lie on the bottom of the folded structure, whereas the connection pads lie on the top of the folded structure. Another assembly having a folded substrate is mounted on top of the folded structure and connected to the folded structure through the connection pads. Also, the connection pads can be used as test terminals for testing the folded structure before or after mounting the same to a circuit panel.

Inaccuracies in folding substrates places connection terminals on the substrate at a position other than their intended position. If an additional microelectronic element or assembly is mounted on top of the folded structure using the connection terminals, the additional microelectronic element will also be displaced from its intended position, further increasing the overall size of the package. Also, displacement of the connecting terminals from their intended position can complicate the tasks of connecting an additional element to the connection terminals and the task of engaging the connecting terminals with a test fixture during a testing operation.

It would be desirable to provide further improvement in substrate folding processes.

SUMMARY OF THE INVENTION

In a first aspect of the present invention, a method of making a microelectronic package comprises folding a substrate for accepting a microelectronic element in a first portion, the substrate having at least one folding portion, by engaging the substrate with a die. The die has an engagement surface so that the at least one folding portion pivots with respect to the first portion about an axis between the first portion and the folding portion. Thus, engagement of the die with the substrate is utilized to form the ultimate shape of the package.

In certain preferred embodiments, the microelectronic element is attached in a central portion of the substrate and the at least one folding portion comprises a first end and a second end of the substrate. The step of engaging the substrate may comprise arranging the substrate so that the first end extends horizontally away from the microelectronic element on one side of the microelectronic element, and the second end extends horizontally away from the microelectronic element on an opposite side of the microelectronic element.

In certain preferred embodiments, the die comprises a first part and a second part and the step of engaging the substrate comprises engaging the first end with the first part and engaging the second end with the second part. The first part and second part cooperatively define the engagement surface and are desirably advanced toward the microelectronic element so that the first end and the second end follow the engagement surface of the die and then travel back over the microelectronic element as the die advances. The first part and the second part may be brought together until an end surface of each part engages one another. After the step of engaging, the connection terminals are desirably disposed on an upper side of the package, facing upwardly. A first microelectronic part may be connected to connection terminals disposed at the first end of the substrate, at the upper side of the package. A second microelectronic element may be connected to connection terminals at the second end of the substrate, at the upper side of the package.

In certain preferred embodiments, the microelectronic element is attached at a first end of the substrate and the folding portion comprises a second, opposite end of the substrate. Before the step of folding, the substrate may be arranged so that the second end extends horizontally away from the microelectronic element on one side of the microelectronic element and the die is advanced so that the engagement surface engages the second end of the substrate.

The die may advance toward the microelectronic element so that the substrate follows the engagement surface of the die and travels back over the microelectronic element as the die advances. After the step of engaging, the connection terminals are desirably disposed on an upper side of the package.

The substrate desirably has mounting terminals and connection terminals thereon. The mounting terminals are desirably formed in a mounting portion of the substrate for mounting the package with other elements and the connections terminals are desirably formed in the folding portion of the substrate. The mounting portion may be co-extensive with the first portion. In other embodiments, the mounting portion overlaps with the first portion or is completely separate from the first portion. A microelectronic part may be connected to the connection terminals and a circuit panel may be connected to the mounting terminals. Any microelectronic element or part may be attached to the connection terminals, the mounting terminals or both, including semiconductor chips, circuit panels, microelectronic components, substrates, microelectronic assemblies, stacked assemblies, passive elements, wafers, or combinations thereof.

In certain preferred embodiments, the substrate carries a microelectronic element in the first portion of the substrate. The substrate may be engaged by the die so that the substrate moves into a position overlying the microelectronic element. The mounting terminals and connection terminals are desirably formed so that the mounting terminals and the connection terminals are exposed at an external surface of the substrate. The step of folding may be performed so that the external surface in the folding portion faces upwardly, at an upper end of the package. A further microelectronic part may be connected to the connection terminals. The step of folding may be performed so that the external surface in the mounting portion of the substrate faces downwardly, at a lower end of the package. A circuit panel or other part may be connected to the mounting terminals.

In certain preferred embodiments, a microelectronic element is attached to an internal surface of the substrate. The microelectronic element comprises a top surface and the method desirably comprises adhering the substrate to the top surface during or after the step of engaging.

In certain preferred embodiments, the substrate desirably comprises a dielectric layer with a plurality of traces connected to connection pads. At least some of the traces desirably extend from the connection pads to the connection terminals and at least some of the traces extend from the connection pads to the mounting terminals. At least some of the traces extend between the mounting terminals and connection terminals.

In certain preferred embodiments, an adhesive layer is provided on the substrate. The adhesive layer may have apertures and the adhesive layer is attached to the dielectric layer so that the connection pads are aligned with the apertures. The microelectronic element desirably has a plurality of contacts and the microelectronic element is attached to the adhesive layer so that the microelectronic element is disposed in the first portion of the substrate and the plurality of contacts face away from the adhesive layer. Wire bonding wires are desirably attached to the plurality of contacts and to the connection pads.

In certain preferred embodiments, the die comprises a first part and a second first defining an opening. The substrate is desirably advanced into the opening so that the folding portion pivots with respect to the first portion of the substrate as the substrate is advanced into the opening. In certain embodiments, the die comprises a third part that engages the folding portion, moving the folding portion downwardly onto a top surface of the microelectronic element. The third part may comprise one or more parts that move inwardly with respect to the substrate to engage the folding portion.

In certain preferred embodiments, the inner surface of the die is shaped so as to correspond to the final desired shape for the package. The engagement surface of the die may also be sized so as to determine the final desired size for the package. In certain preferred embodiments, the step of folding comprises engaging the substrate with the die more than once. The step of folding may also comprise engaging the substrate with a plurality of dies, each of the dies comprising a differently shaped engagement surface than the other of the dies. The step of folding may also include moving the die in more than one direction. Thus, each microelectronic package produced in methods according to embodiments of the present invention is substantiality the same size and shape, facilitating assembly with other elements.

DETAILED DESCRIPTION

Figure 1:
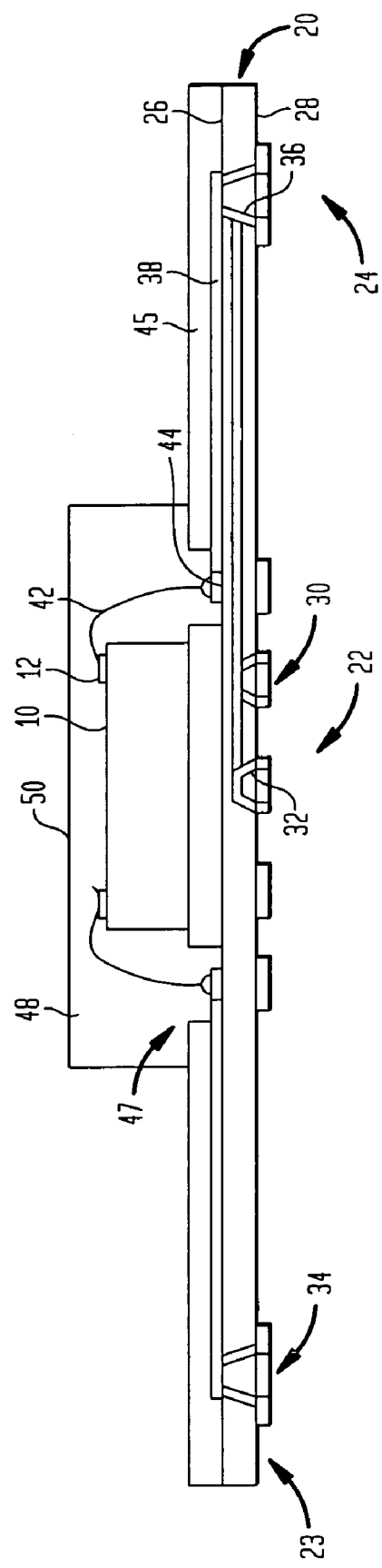
FIG. 1 is a cross-sectional view of a substrate in a method in accordance with an embodiment of the invention.
Figure 2:
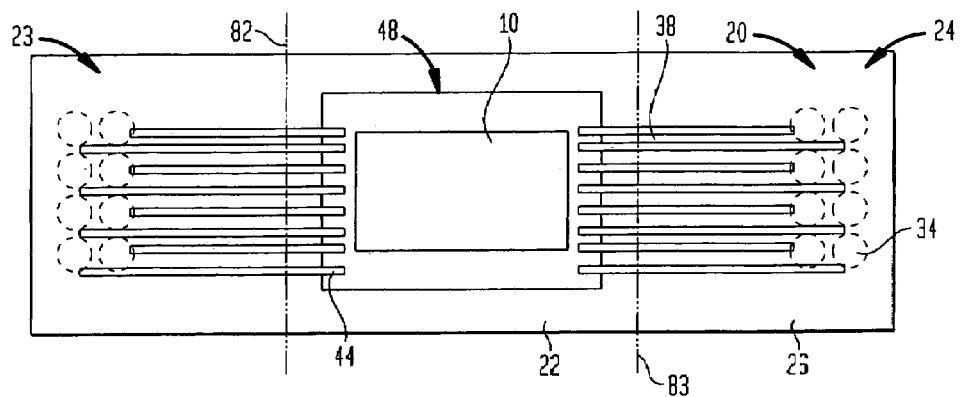
FIG. 2 is a schematic top plan view of a substrate in a method in accordance with the embodiment of FIG. 1.

A method of making a microelectronic package, according to one embodiment, is shown in FIGS. 1–5. The method includes providing a microelectronic element 10 on a substrate 20. The substrate 20 comprises an elongated strip of dielectric material having a central portion 22, a first end 23 and a second end 24 opposite the first end 22. The substrate is arranged so that an interior surface 26 faces upwardly and an exterior surface 28 faces downwardly. As used herein, directional terms such as "upwardly", "downwardly", "top" or "bottom" do not refer to any gravitational frame of reference. Rather, these directional terms are relative to the package.

A set of electrically conductive mounting terminals 30 are provided in the central portion 22 of the substrate. Terminals 30 are disposed at or near the interior surface 26 of the substrate and exposed to the exterior surface 28 through holes or vias 32 extending through the substrate. Connection terminals 34 are provided in the first end 23 and second end 24 of the substrate. The connection terminals 34 are exposed to the external surface 28 of the substrate through holes 36. The substrate also includes electrically conductive traces 38 having connection pads 44. Some of the traces are connected to the connection pads 44 and extend from the central portion 22 to the connection terminals 34 in the first end 23, whereas other traces extend from the connection pads 44 to the connection terminals 34 in the second end 24. At least some traces interconnect at least some of the connection terminals 34 with at least some of the mounting terminals 30 and some connect the connection pads to the mounting terminals. Only a few of the traces 38 are depicted in FIG. 1 for clarity of illustration. None of the drawings are to scale and various parts shown may be enlarged for clarity of illustration.

Substrate 20 may be formed from essentially any flexible dielectric material as, for example, one or more layers of a dielectric such as polyimide, BT or flexibilized epoxy. The conductive features such as terminals 30 and 34 and traces 38 may be formed from a conventional metallic elements of the type commonly used in flexible circuitry as, for example, copper, gold, alloys thereof, or combinations thereof, formed by selective deposition such as plating or by selective removal from a layer, as by etching. The techniques commonly employed to make flexible circuitry can be employed in fabrication of substrate 20 and the metallic features thereon. The substrate may include additional features as, for example, one or more additional layers of traces and electrically conductive planes such as metallic layers which can serve as a ground or power planes and which cooperate with the traces to form controlled impedance striplines.

A microelectronic element 10, such as a semiconductor chip, is mounted on the interior surface 26 of the substrate in the central portion 22. Element 10 is electrically connected to at least some of the conductive features on the substrate in a conventional manner as, for example, by wire bonding using fine wires 42 to connect contacts on the chip to connection pads 44 connected to the traces. The microelectronic element 10 may comprise one or more semiconductor chips, circuit panels, microelectronic components, substrates, microelectronic assemblies, stacked assemblies, passive elements, wafers, or combinations thereof. The microelectronic element 10 is preferably attached to the substrate 20 and may be attached utilizing an adhesive applied in at least the central portion 22. The substrate 20 preferably carries on its interior surface 26 an adhesive layer laminated onto the substrate 20. The adhesive layer 45 includes apertures 47 aligned with the connection pads 44 so that the contacts 12 may be bonded to the connection pads 44. The microelectronic element on the substrate may also include a layer of compliant material, or the adhesive material may itself comprise a layer of compliant material. The microelectronic element 10 is desirably protected by overmolding 48. Essentially any material commonly used as a protective overmolding material in electronic packaging can be employed. The overmolding 48 forms a top surface 50 for the microelectronic element 10, as shown in FIG. 1.

Although FIGS. 1–5 show a single microelectronic element 10, it should be appreciated that these processing steps can be performed while substrate 20 is a part of a larger sheet or tape. For example, substrate 20 can be formed as part of a continuous or semi-continuous tape. Furthermore, the resulting package may include more than one microelectronic element 10.

Figure 3:
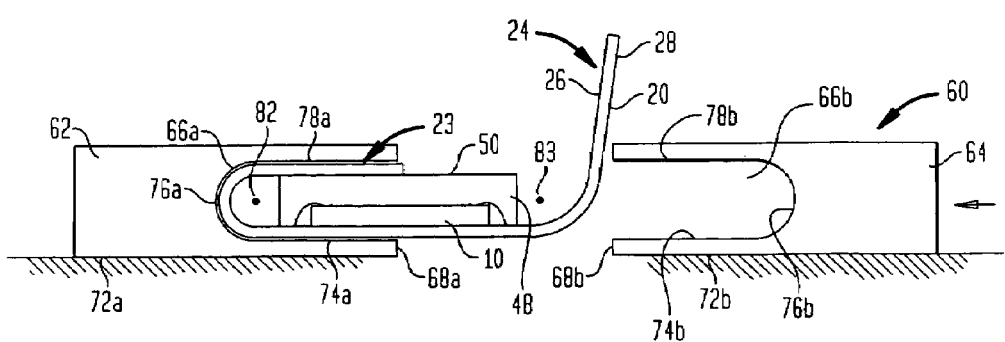
FIG. 3 is a cross-sectional view of a substrate at a later stage in a method in accordance with the embodiment of FIGS. 1 and 2.

In the next stage of the process, the substrate 20 is folded over upon itself by bending generally around a first axis 82 between the central portion 22 and the first end 23 and around a second axis 83 between the central portion 22 and the second end 24 of the substrate. In this condition, the first end 23 and second end 24 of the substrate overlies the central portion, with the interior surface 26 facing downwardly toward the microelectronic element 10. As shown in FIG. 3, the folding is performed by engaging the substrate 20 with at least one die 60. The die shown in FIG. 3 comprises a first part 62 and a second part 64. The microelectronic element 10 and the substrate 20 are arranged so that the first end 23 extends away from the microelectronic element 10 on one side of the microelectronic element, and the second end 24 extends away from the microelectronic element 10 on the other side. First part 62 has a recess 66a formed in an end surface 68a. End surface 68a lies in a vertically oriented plane and is perpendicular to a preferably planar bottom side 72a. The recess 66a preferably comprises a generally U-shaped recess in the cross-section shown in FIG. 3. The recess 66a includes a lower surface 74a lying in a generally horizontal plane. The lower surface 74a leads into a curved surface 76a that extends from the lower surface 74a to the upper surface 78a, also lying in a generally horizontal plane. The second part 64 has corresponding features, including a recess 66b formed in the end surface 68b. The second part 64 also has a generally planar bottom side 72b. The recess 66b includes a lower surface 74b leading into a curved surface 76b, which extends to an upper surface 78b, forming a generally u-shaped recess in the cross-section shown in FIG. 3.

The microelectronic element 10 and substrate 20 are arranged with respect to the first part 62 and second part 64 so that the first part 62 is adjacent first end 23 and second part 64 is adjacent second end 24. The first part 62 of the die 60 is advanced toward the first end 23. The first part desirably slides along a planar, horizontal surface, so as to be guided thereby. As the first part 62 advances towards the microelectronic element 10, an engagement surface engages the first end 23 so that the first end 23 pivots with respect to the central portion 22. First, the lower surface 74a engages the first end 23 of the substrate 20. The lower surface 74a guides the first end 23 to the curved surface 76a and, as the first part 62 advances toward the microelectronic element 10, the first end 23 is directed upwardly and around the curved surface 76a. The first end 23 curves around the first axis 82 and meets the upper surface 78a. The first end 23 follows upper surface 78a and is directed over the top surface 50. Second part 64 is also directed towards the microelectronic element 10 so that an engagement surface engages the second end, pivoting the second end with respect to the central portion 22. The substrate 20 is folded in a similar manner, around second axis 83 so that the second end 24 overlies the top surface 50. The first part 62 and second part 64 may be advanced at the same time, or separately, or the substrate 10 and microelectronic element may be moved in relation to the first part 62 and second part 64. The microelectronic element 10 and substrate 20 may be supported in a machine for advancing the die, as known in the die-forming and progressive die forming art. The substrate is desirably formed with holes used for aligning and registering the substrate during processing operations, such as the sprocket holes commonly provided on tape-like substrates. For example, the substrate may have an alignment element projecting from a part of the substrate remote from a set of socket holes, which engage one another when the substrate is folded.

Figure 4:
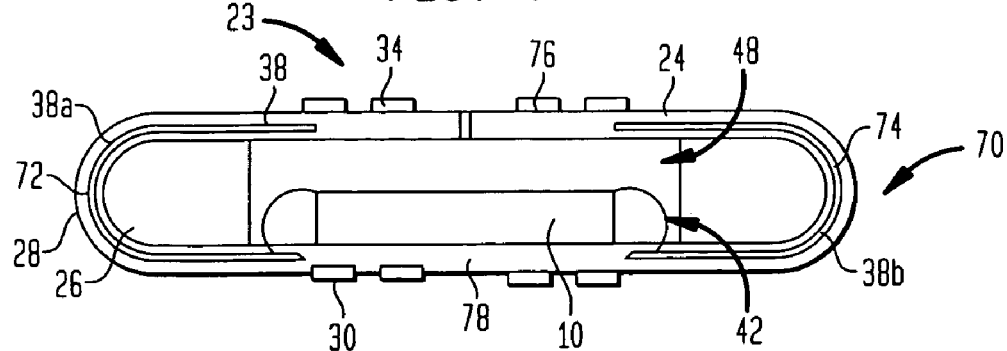
FIG. 4 is a cross-sectional view of a substrate at a later stage in a method in accordance with the embodiments of FIGS. 1 through 3.
Figure 5:
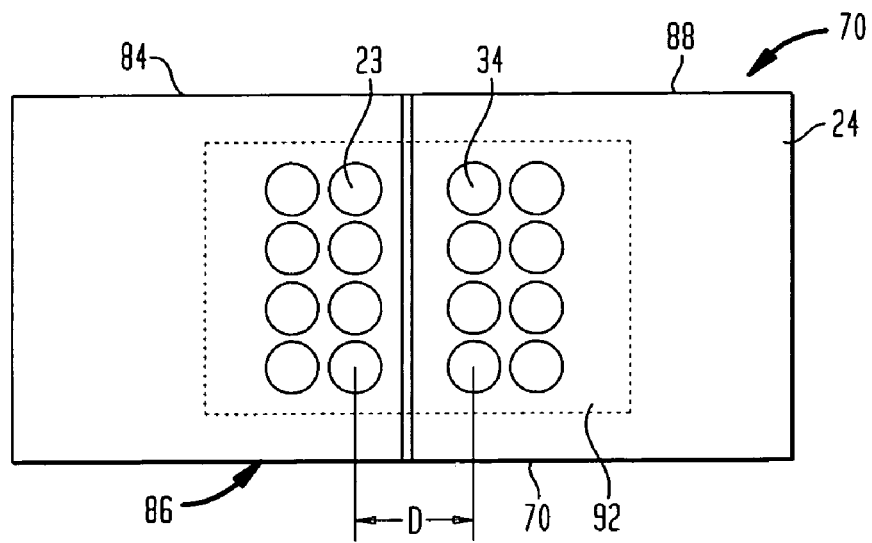
FIG. 5 is a top plan view of a microelectronic package in the method in accordance with the embodiment of FIGS. 1 through 4.

After folding, a microelectronic package 70 is produced, as shown in FIGS. 4 and 5. The interior surface 26 at the first end 23 and second end 24 of the substrate 20 is adhered to the top surface 50 utilizing pressure and/or heat. The size and shape of the recesses 66a and 66b may be sufficient to press the first end 23 and second end 24 against the top surface 50 and adhere the first end 23 and the second end 24 to the top surface 50. Preferably, the recess 66a and recess 66b are sized and shaped to produce a microelectronic package 70 having a predetermined size and shape. The microelectronic package 70 has a first arcuate side 72 and a second arcuate side 74. The connection terminals 34 are located on a top side 76 of the package and generally overlie the microelectronic element 10. The traces 38 interconnect the connection terminals 34, mounting terminals 30 and connection pads 44, as discussed above. The mounting terminals 30 are located at a bottom side 78 of the package. The first end 23 and second end 24 desirably meet at the top end of the package. An additional die may be used to readjust the positions of the first end 23 and second end 24 in the event that the first end 23 and second end 24 are displaced with respect to one another after folding. For example, the first end 23 has a first lateral side 84 and a second lateral side 86, whereas the second end 24 has a first lateral side 88 and a second lateral side 90. If the first sides 84 and 88 are not aligned with one another, or if the second sides 86 and 90 are not aligned with one another, a further element or part placed on top of the package 70 may not be accurately bonded to the connection terminals 34. For example, a further element 92, shown in phantom lines in FIG. 5, typically has an area array of pads or other terminal structures for interconnection with the connection terminals 34. If the first end 23 and second end 24 are displaced with respect to one another, some of the connection terminals 34 might not meet up with the terminal structures on the additional element 92, or inferior connections may be formed.

The package 70 discussed above with reference to FIG. 4 has a first set of traces 38a extending along the substrate from the central part 22 of the substrate to the first end 23 and has a second set of traces 38b extending from the central part 22 to the second end 24. At least some of the connection terminals 34 in the second end 24 of the substrate 20 are connected to at least some of the mounting terminals 30 in the central part 22 of the substrate or to the microelectronic device 10 on the central part 22 of the substrate by the traces 38b of the second set, whereas at least some of the connection terminals 34 on the first end 23 of the substrate 20 are connected to the mounting terminals 30 or first microelectronic device 10 in the central part 32 by the first set of traces 38a. Thus, in the folded package 70, the combined array of connection terminals 34 in the first end 23 and second end 24 at the top 76 of the package 70 is connected to mounting terminals 30 and device 10 at the bottom 78 of the package 70 in part by the first set of traces 38a extending across one arcuate side 72 and in part by the second set of traces 38b extending across the other arcuate side 74, on the other side of the package 70. This arrangement significantly simplifies routing of the traces within the substrate. The number of traces in each set can be one-half the number which would be required to connect all of the terminals using a single set of traces extending across a single fold. This simplified routing can reduce the number of metallic layers required in the substrate. In many cases, all of the traces can be formed in a single layer.

Numerous variations and combinations of the features discussed above can be utilized without departing from the present invention. In one such variant, the roles of the mounting terminals and connection terminals discussed above are reversed. For example, the package of FIG. 4 can be mounted to the circuit board by connection terminals 34 and additional microelectronic devices or packages can be connected to mounting terminals 30. Similarly, the combined array of connection terminals at the top end 76 can be used to mount the package 70 to the circuit panel, so that the mounting terminals 30 face upwardly, away from the circuit panel. The mounting terminals can be used to connect an additional package or other device. Also, terminals other than the solder-bondable pads shown in the drawings, such as pins projecting from the substrate and adapted to be received in a socket, can be employed.

Figure 6:
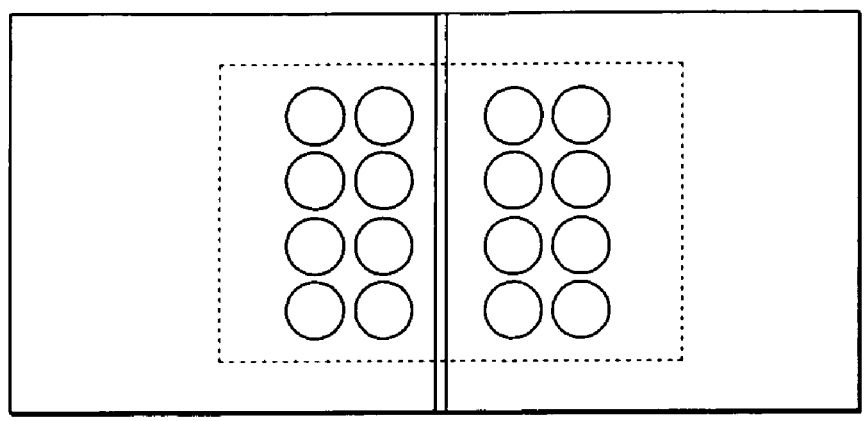
FIG. 6 is a top plan view of a microelectronic package in accordance with a further embodiment of the invention.

In certain preferred embodiments, the connection terminals 34 comprise elongated pads, as shown in FIG. 6. Alternatively, the connection terminal 34 may be slightly larger to provide additional play in forming connections. In embodiments in which a first further element 94 is connected to the connection terminals 34 at the first end 23 and a second element 96 is connected to the connection terminal 34 at the second end 24, slight misalignment of the first end 23 and second end 24 may be inconsequential.

Figure 7:
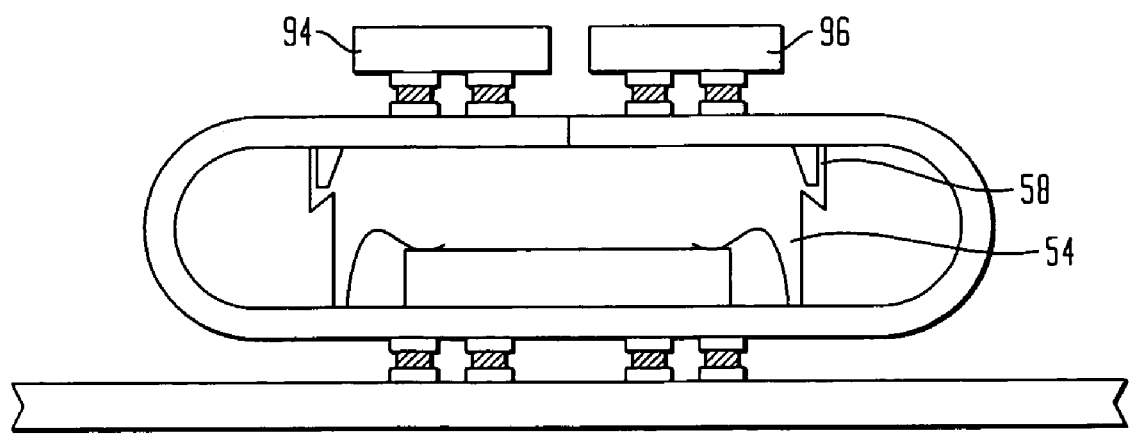
FIG. 7 is a cross-sectional view of a microelectronic package in accordance with a further embodiment of the invention.

The mounting terminals 30 are used to form connections with further elements, which may comprise any microelectronic elements, devices, components, etc. Typically, the mounting terminals are utilized to connect to terminals of a circuit panel, as shown in FIG. 7. Although the connections with the connection terminals 34 and mounting terminals 30 are shown utilizing bonding material, such as solder, these connections can be formed utilizing any conventional technique.

In certain preferred embodiments, the substrate has a first alignment element 54 and a second alignment element 58 that engage one another upon folding of the substrate (See FIG. 7). The first alignment element 54 desirably comprises a feature of the overmolding 48. The engaged elements limit relative movement of the two ends 23 and 24 in at least some directions parallel to the planes of these parts of the substrate. As the parts are engaged with one another during the folding operation, the engagement of the first and second alignment elements 54 and 58 brings the two ends parts 23 and 24 of the substrate to the desired relative positions with respect to the central portion 22. The alignment elements desirably include inter-fitting parts that assure that the connection terminals 34 at the top end 76 of the assembly will lie in the desired positions in the horizontal directions relative to the mounting terminals 30. Consequently, if a further element is mounted on connection terminals 34, that further element also can be precisely registered with the mounting terminals 30 in the horizontal directions. The first alignment element 54 and second alignment element 58 may be formed as disclosed in certain embodiments of U.S. provisional application entitled Microelectronic Packages with Self-Aligning Features, filed Aug. 16, 2002, by inventors Bang, et al., the disclosure of which is hereby incorporated by reference herein.

Figure 8A:
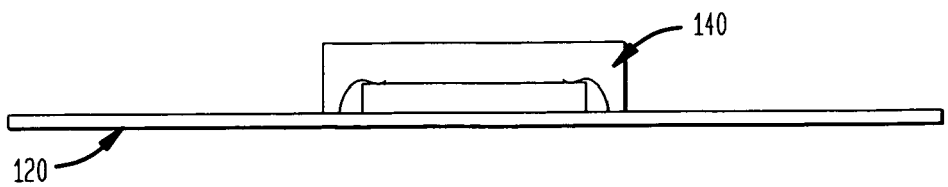
FIG. 8A is a substrate in a method in accordance with another embodiment of the invention.
Figure 8B:
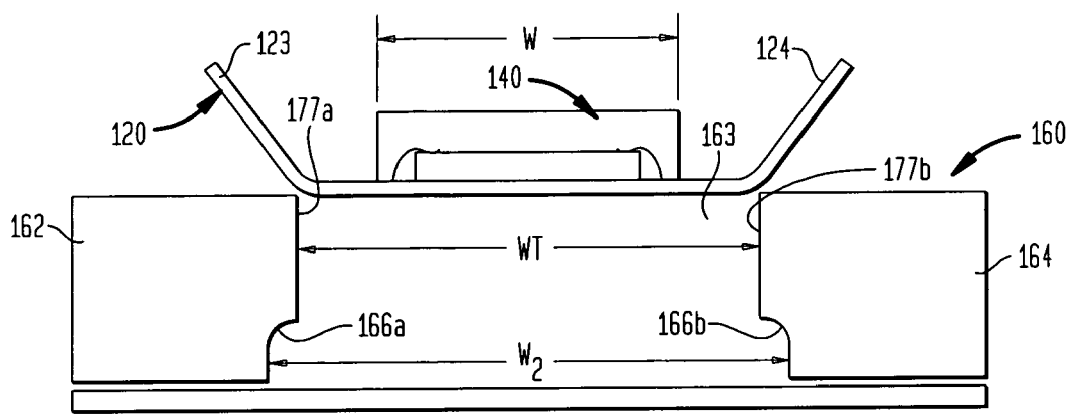
FIG. 8B is a substrate in accordance with the embodiment of FIG. 8A, at a later stage the method.

A further method in accordance with embodiments of the present invention is shown in FIGS. 8A through 8D. A microelectronic device 140 on a substrate 120 is provided, as shown in FIG. 8A. A die 160 having a first part 162 and a second part 164 defining an opening 163 is arranged with respect to the microelectronic device 140 and substrate 120 so that the microelectronic device 140 is aligned with the opening 163. As shown in FIG. 8B, the opening 163 has a pre-determined width $W_1$, slightly larger than the width W of the microelectronic device 140. The device and substrate are moved downwardly into the opening to a recess 166a formed in the first part 162 and recess 166b in the second part 164. The recesses comprise a portion of the opening 163 that has a somewhat larger, predetermined width $w_2$. This portion of the opening is defined by curved surfaces in the first part and second part of the die. As shown in FIG. 8B, as the substrate 120 and device 140 are advanced downwardly, the substrate 120 is folded by the edges 177a and 177b of the die, and pivot around axes 82 and 83.

Figure 8C:
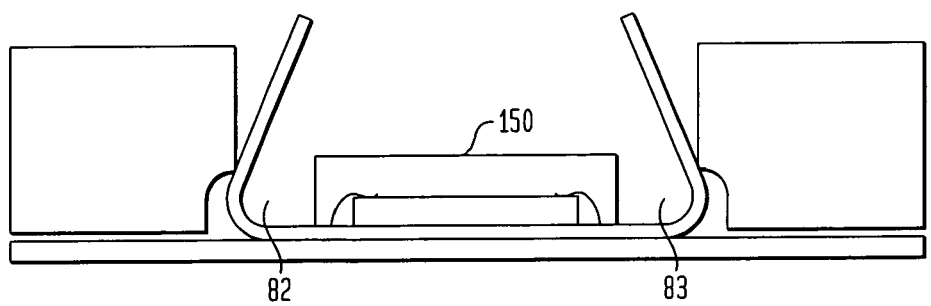
FIG. 8C is a cross-sectional view of a substrate at a later stage in the method in accordance with the embodiment of FIGS. 8A and 8B.
Figure 8D:
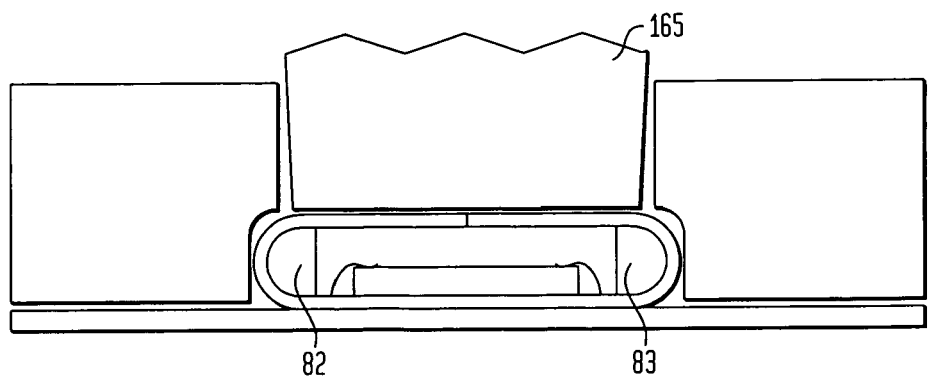
FIG. 8D is a cross-sectional view of a substrate at a later stage in a method in accordance with the embodiment of FIGS. 8A through 8C.

As shown in FIG. 8C, the first end 123 and the second end 124 of the substrate are folded inwardly towards the device 140 as the curved surfaces in recesses 166 engage the substrate 120. The folding of the substrate is completed by the introduction of a third part 165 into the opening 163. The third part 165 is advanced downwardly to engage the first end 123 and second end 124 with the top surface 150 of the device (FIG. 8D). The inner surface 126 of the substrate 120 carries an adhesive, at least on the first end 123 and second end 124, so that when the first end 123 and second end 124 are engaged with the top surface 150, the first end 123 and second end 124 are adhered thereto. In other preferred embodiments, the first part 162 and second part 164 of the die 160 may be moved inwardly toward the device 140, to achieve further, progressive folding of the substrate 120 over the device 140.

Figure 9A:
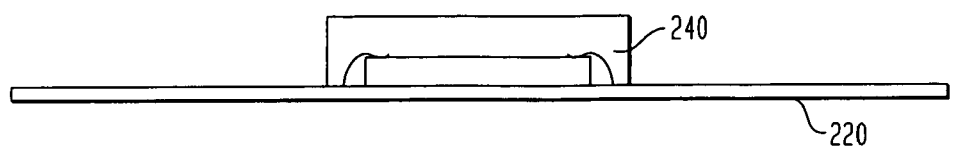
FIG. 9A is a substrate in a method in accordance with a further embodiment of the invention.
Figure 9B:
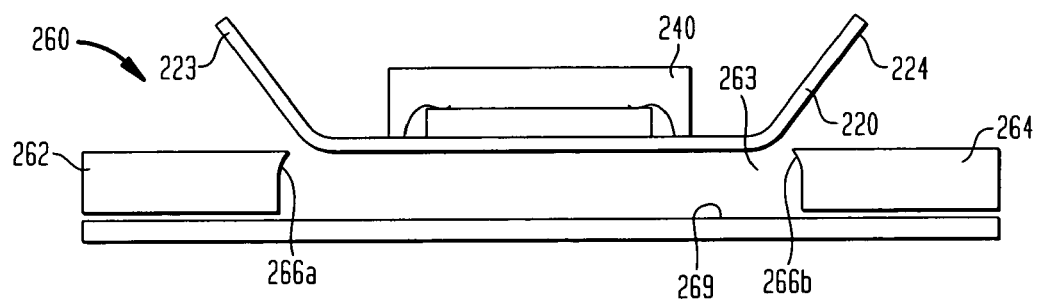
FIG. 9B is a cross-sectional view of a substrate at a later stage in a method in accordance with the embodiment of FIG. 9A.
Figure 9C:
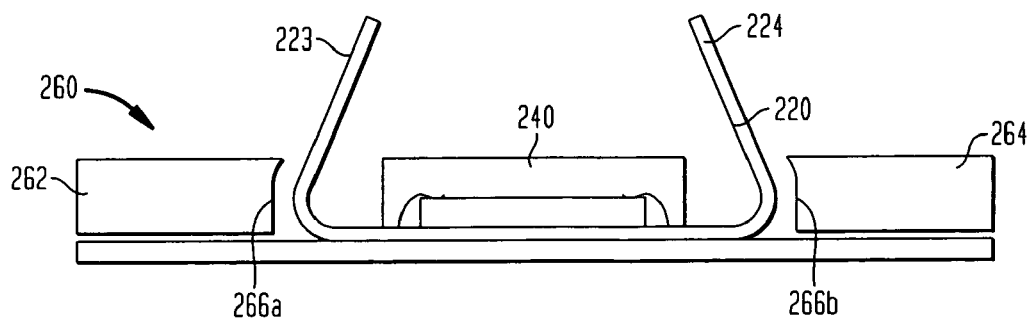
FIG. 9C is a cross-sectional view of a substrate at a later stage in a method in accordance with the embodiment of FIGS. 9A and 9B.
Figure 9D:
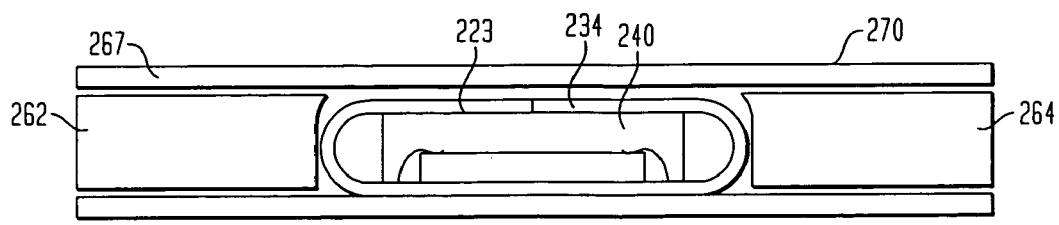
FIG. 9D is a cross-sectional view of the substrate at a later stage in a method in accordance with the embodiment of the FIGS. 9A through 9C.

In a further embodiment of the present invention, a device 240 on a substrate 220 is provided, as shown in FIG. 9A. As shown in FIG. 9B, a die 260 having a first part 262 and a second part 264 is provided so that an opening 263 in the die 260 is arranged with the device 240 and substrate 220. The first part 262 has a recess 266a and second part 264 has a recess 266b forming curved surfaces. The device 240 and substrate 220 are advanced into the opening so that the curved surfaces defined on the first part and second part partially fold the first end 223 and second end 224 of the substrate toward the device, pivoting the ends of the substrate around their respective axes 82 and 83. (FIG. 9B) After the device and substrate reaches the bottom 269 of the opening 263, a first plate 267 and second plate 270 are advanced over the opening (FIGS. 9C and 9D). For example, the first plate 267 and second plate 270 may slide upon upper surfaces of the first part 262 and second part 264 so that the first plate 267 and second plate 270 are advanced toward the opening 263 and engage the first end 223 and second end 224 of the substrate 220. As the first plate 267 and second plate 270 approach one another, the first end and second end of the substrate are progressively folded downwardly toward the top surface 250 of the device 240, as shown in FIG. 9D. Adhesive is disposed on the inner surface of the substrate, at least at the first end 223 and second end 224 so that the first end 223 and second end 224 are adhered to the top surface 250 of the device during or after engagement with the first plate 267 and second plate 270. In further embodiments, dies having one or more parts with surfaces for engaging the substrate are utilized to fold the substrate in a progressive manner, or in a single engagement with a single die. Although figures discussed above show dies with curved recesses, any other shape may be used.

Figure 10:
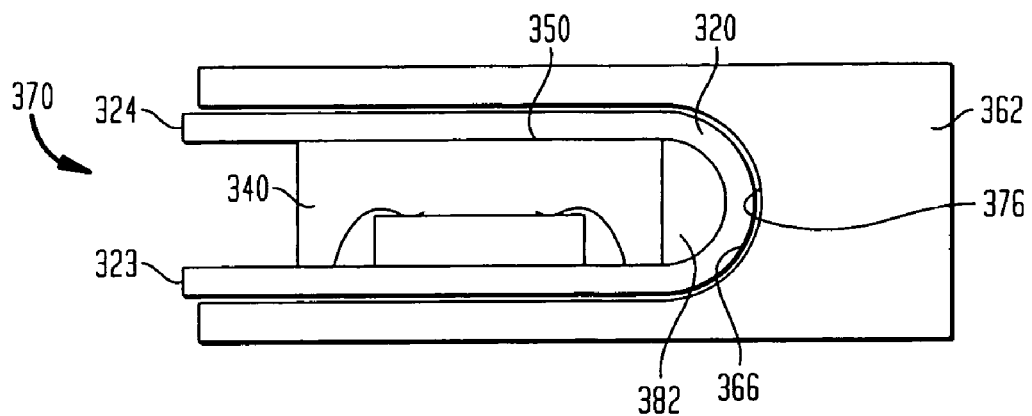
FIG. 10 is a cross-sectional view of a substrate in a method in accordance with another embodiment of the invention.

As shown in FIG. 10, a die having a single part 362 may be used to fold a substrate 320 in a method for forming a package 370. In the embodiment shown, the die part 362 includes a U-shaped recess 366. A device 340 on a substrate 320 is provided so that a second end 324 of the substrate 320 extends outwardly away from the device, substantially horizontally. The device 340 is disposed at the first end 323 of the substrate 320. The die part 362 is advanced toward the device so that the substrate's second end 324 engages the recess 366. The recess 366 of the die includes a curved surface 376. As the die part 362 advances towards the device 340, the second end 324 engages the curved surface 376, is oriented upwardly, and then travels back over the device 340, pivoting around axis 382. The substrate 320 has an adhesive disposed on the inner surface, at least in the second end 324, so that during or after engagement with the die part 362, the substrate 320 is adhered to the top 350 of the device 340. The die is generally as discussed above, except that the dimensions of the recess 366 determine the desired size and dimensions for the entire package, whereas the recesses in parts 62 and 64 cooperatively determine those dimensions.

Figure 11:
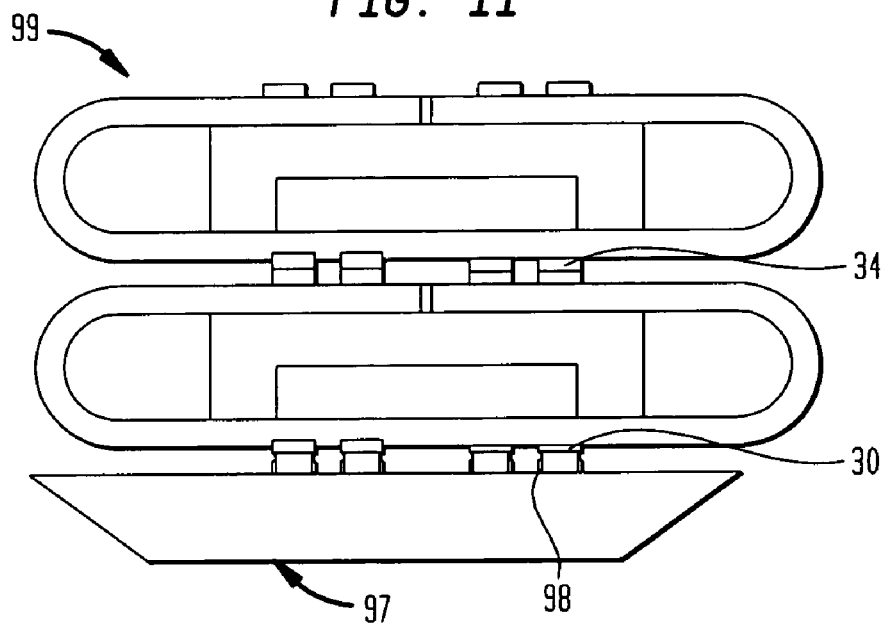
FIG. 11 is a microelectronic assembly in a method in accordance with a further embodiment of the invention.
Figure 12:
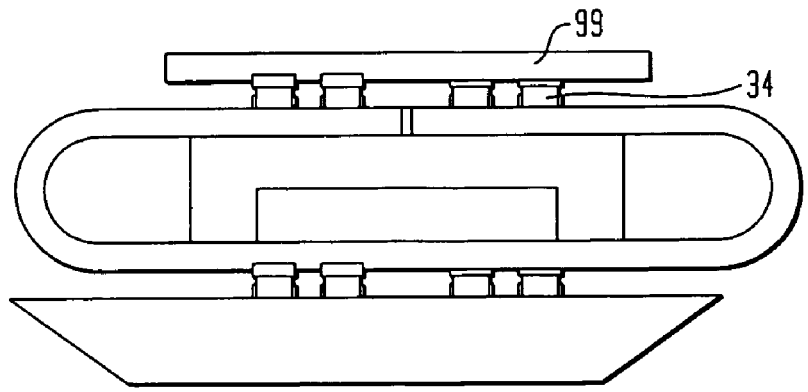
FIG. 12 is another microelectronic assembly in a method in accordance with another embodiment of the invention.

The packages formed may be mounted to a circuit panel by attaching mounting terminals 30 to contact pads 98 of a circuit panel 97. Before or after the package is mounted to the circuit panel, one or more additional parts 99 such as additional packaged or unpackaged microelectronic parts can be mounted to the top of the package, as by connecting such additional devices to the connection terminals 34, as shown in FIGS. 11 and 12. The additional package may be a package identical to the package of FIG. 4 and two or more such packages can be connected in a stack.

Figure 13:
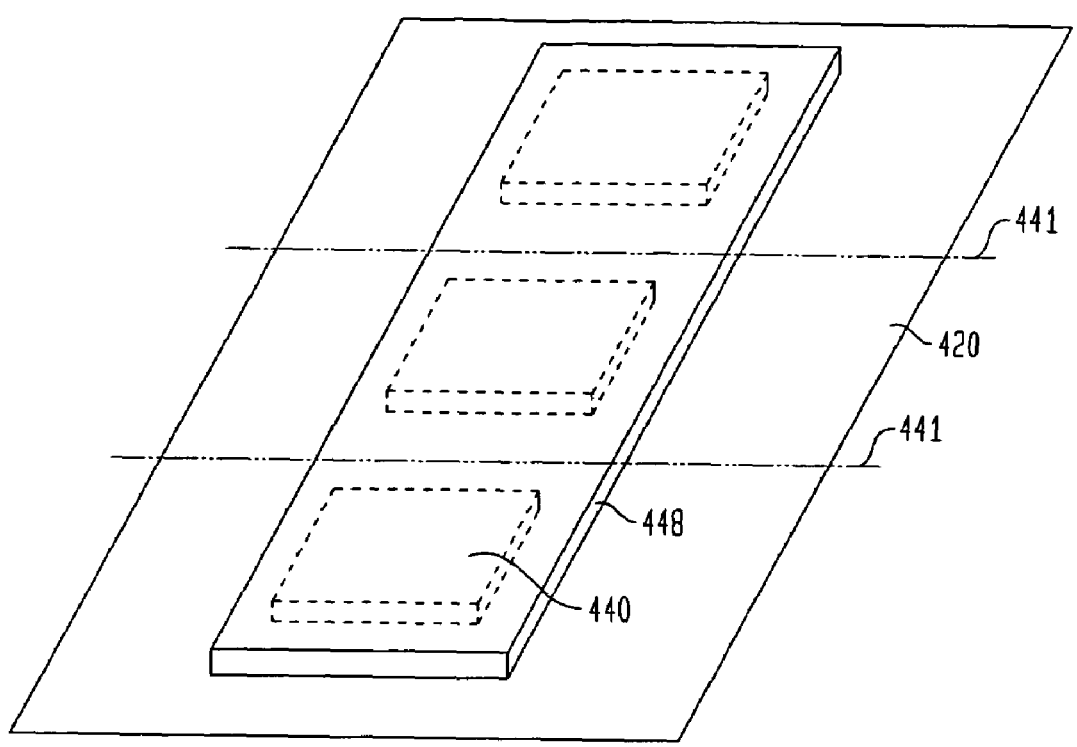
FIG. 13 is a top right perspective view of a substrate having a plurality of microelectronic elements in a method in accordance with a further embodiment of the invention.
Figure 14:
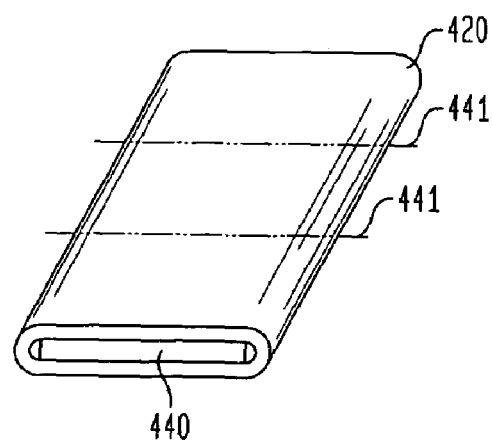
FIG. 14 is the substrate and microelectronic elements at a later stage in the method in accordance with the embodiment of FIG. 13.

Several microelectronic devices may be included all enclosed in a common mass of overmolding and incorporated in a folded package. The substrate preferably includes alignment elements that inter-engage with one another, as discussed above, to assure that the overlapping portions of the substrate are in precise registration with one another. In further embodiments, a plurality of devices 440 may be disposed on a single substrate 420 in the form of a strip, sheet or tape, and folded as shown in FIGS. 13 and 14. After the adhesive has set and formed a bond, the component may be severed, as by cutting along one or more of the lines 441, so as to separate portions of the folded component from one another and form individual units, each including one or more of the microelectronic devices 440 and the associated portions of the folded substrate 420. The devices may or may not be incorporated in the same overmolding 448. At the same time, the substrate can be severed along further lines so as to trim off undesired portions of the substrate, or fewer lines so as to include more than one element or device in the package with the folded substrate.

Methods according to embodiments of the present invention can be used in more complex folded structures. For example, as disclosed in commonly-assigned, co-pending U.S. patent application Ser. No. 10/077,388, filed Feb. 15, 2002, the disclosure of which is hereby incorporated by reference herein. A substrate in a generally cruciform shape having multiple arms extending from a central region can be folded utilizing one or more die parts, in one or more steps so that the various arms all overlie the central region, and so that microelectronic devices positioned on all of the arms are stacked one above the other. In addition, one or more die parts may be used to form the serpentine structure disclosed in certain embodiments of U.S. Pat. No. 6,225,688, the disclosure of which is hereby incorporated by reference herein.

Figure 15:
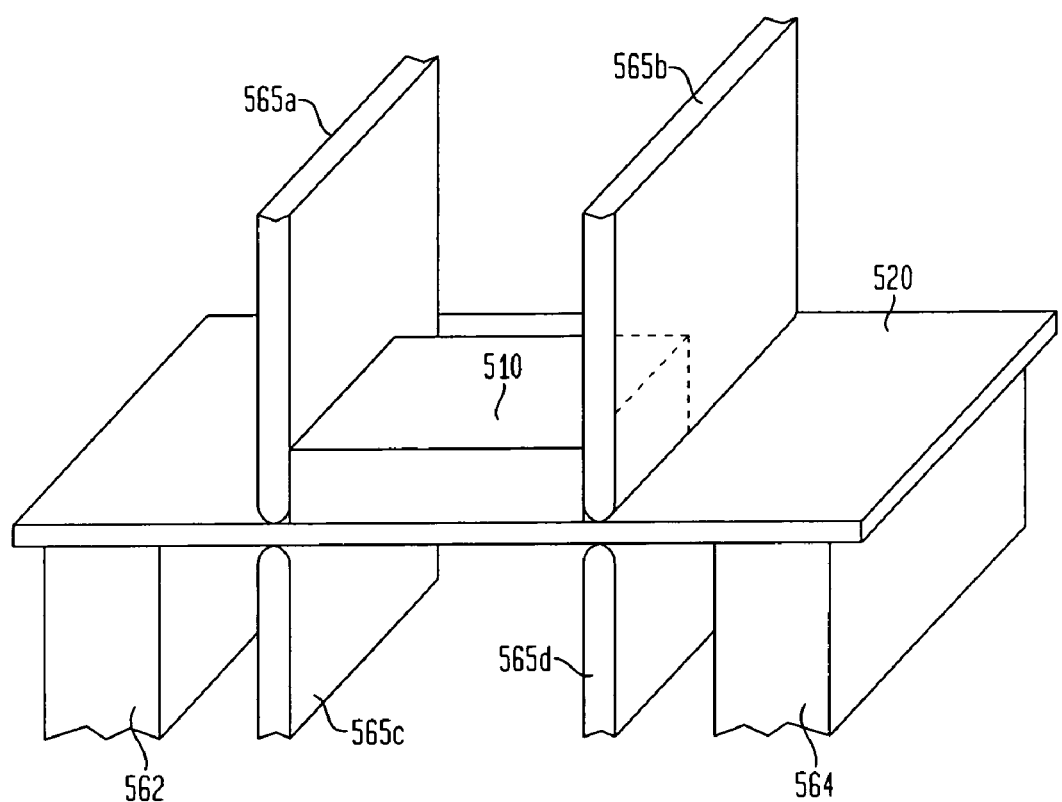
FIG. 15 is a top right perspective view of a substrate in a method in accordance with a further embodiment of the invention.

In further embodiments of the invention, folding elements are used to engage and/or guide the substrate. As shown in FIG. 15, for example, the step of folding includes engaging substrate 520 with folding elements 565*a*, 565*b*, 565*c*, and 565*d*. Folding element 565*a* is arranged on an upper side of the substrate 520 and folding element 565*c* is arranged on a lower side of the substrate so as to grip the substrate between the folding elements 565*a* and 565*c*. Folding elements 565*b* and 565*d* are similarly arranged on either side of the substrate, except that these elements are disposed on the opposite side of the microelectronic element 510 from the folding elements 565*a* and 565*c*. The substrate is gripped by the pairs of folding elements while engaged by an engagement surface of first die part 562 and second die part 564. In other embodiments, folding elements 565*c* and 565*d* are eliminated and folding elements 565*a* and 565*b* are used to guide the folding of the substrate.

Figure 16:
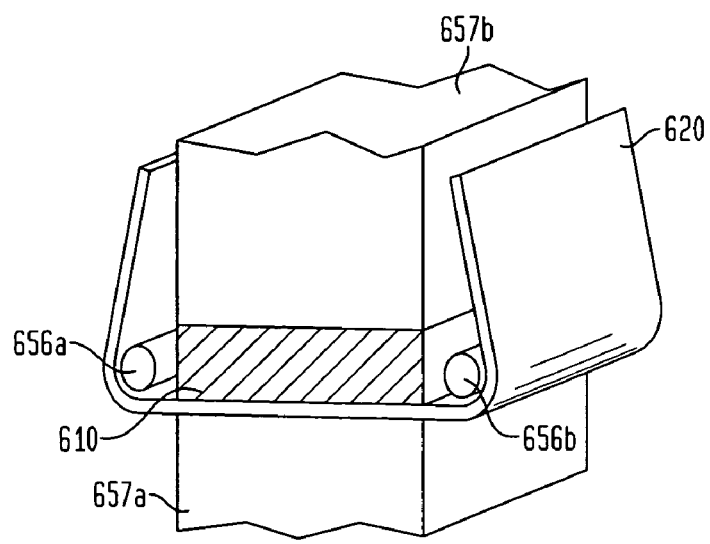
FIG. 16 is a top right perspective view of a substrate in a method in accordance with yet another embodiment of the invention.

In further embodiments, as shown in FIG. 16, the microelectronic element 610 is engaged by holding elements 657*a* and 657*b* during the folding step. Folding elements 656*a* and 656*b* may also be used to engage and/or guide the substrate 620 during folding.

As these and other variations and combinations of the features discussed above can be utilized without departing from the present invention, the foregoing description of the preferred embodiment should be taken by way of illustration rather than by way of limitation of the invention as defined by the claims.

The invention claimed is:

1. A method of making a microelectronic package, comprising:
   a) providing a substrate having a length in a first portion to mount a microelectronic element therein said substrate having at least one folding portion;
   b) folding the substrate by engaging the substrate with a die having an engagement surface so that said at least one folding portion of said substrate pivots with respect to said first portion about an axis between said first portion and said folding portion, said engagement surface having a second length, such that as said engagement surface of said die engages the first portion and folding portion of said substrate and folds said substrate, said engagement surface extends at least substantially over the entire length of said microelectronic element to cause said substrate to extend at least substantially over the entire length of the microelectronic element.

2. The method of claim 1, wherein said substrate carries a microelectronic element at a first end of said substrate and said folding portion comprises a second end, said second end of said substrate being opposite said first end.

3. The method of claim 2, wherein, before said step of folding, said substrate is arranged so that said second end extends horizontally away from said microelectronic element on one side and said engagement surface engages said second end of said substrate.

4. The method of claim 3, wherein said die advances toward said microelectronic element so that said second end follows said engagement surface and travels back over said microelectronic element as said die advances.

5. The method of claim 3, wherein, after said step of folding, said second end is disposed on an upper side of the package.

6. The method of claim 5, wherein said substrate has connection terminals at said second end and further comprising attaching a microelectronic part to said connection terminals.

7. The method of claim 1, wherein said substrate comprises mounting terminals and connection terminals.

8. The method of claim 7, wherein said mounting terminals are formed in a mounting portion of said substrate for mounting the microelectronic package with other elements and said connection terminals are formed in said folding portion of said substrate.

9. The method of claim 8, wherein said mounting portion is coextensive with said first portion.

10. The method of claim 7, wherein said substrate comprises a dielectric layer with a plurality of traces connected to a plurality of connection pads.

11. The method of claim 10, wherein at least some of said plurality of traces extend from said plurality of connection pads to said connection terminals and at least some of said plurality of traces extend from said plurality of connection pads to said mounting terminals.

12. The method of claim 10, wherein at least some of said plurality of traces extends from said connection terminals to said mounting terminals.

13. The method of claim 10, wherein said plurality of connection pads are connected to a plurality of contacts of said microelectronic element.

14. The method of claim 10, further comprising providing an adhesive layer on said substrate, the adhesive layer having apertures and attaching said adhesive layer with said dielectric layer so that said plurality of connection pads are aligned with said apertures.

15. The method of claim 14, further comprising attaching said microelectronic element having a plurality of contacts to said adhesive layer so that said microelectronic element is disposed in said first portion and said plurality of contacts face away from said adhesive layer.

16. The method of claim 15, further comprising attaching wire bonding wires to said plurality of contacts and to said plurality of connection pads.

17. The method of claim 1, wherein said substrate carries a microelectronic element in said first portion of said substrate.

18. The method of claim 17, wherein said substrate is engaged by said die so that said substrate moves into a position overlying said microelectronic element.

19. The method of claim 17, wherein said substrate includes mounting terminals and connection terminals exposed at an external surface of said substrate.

20. The method of claim 19, wherein said step of folding is performed so that said external surface in said folding portion faces upwardly, at an upper end of the microelectronic package.

21. The method of claim 20, further comprising connecting a further microelectronic part to said connection terminals.

22. The method of claim 21, wherein said step of folding is performed so that said external surface in the folding portion of said substrate faces downwardly, at a lower end of the microelectronic package.

23. The method of claim 22, further comprising connecting a circuit panel to said mounting terminals.

24. The method of claim 1, wherein said substrate includes an internal surface further comprising attaching the microelectronic element to said internal surface of said substrate.

25. The method of claim 24, wherein the microelectronic element comprises a top surface and further comprising adhering said folding portion of said substrate to said top surface during or after said step of engaging.

26. The method of claim 1, wherein said engagement surface of said die is shaped so as to correspond to a final desired shape for the microelectronic package.

27. The method of claim 1, wherein said engagement surface of said die is sized so as to determine a final desired size for the microelectronic package.

* * * * *